(12) United States Patent
Feng et al.

(10) Patent No.: US 8,188,360 B2
(45) Date of Patent: May 29, 2012

(54) THERMOELECTRIC CONVERSION DEVICE

(75) Inventors: Suh-Yun Feng, Hsinchu (TW); Chun-Kai Liu, Taipei (TW); Ming-Che Hsieh, Kaohsiung (TW); Chih-Kuang Yu, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 298 days.

(21) Appl. No.: 12/429,193

(22) Filed: Apr. 24, 2009

(65) Prior Publication Data

US 2010/0224226 A1     Sep. 9, 2010

(30) Foreign Application Priority Data

Mar. 5, 2009   (TW) .............................. 98107137 A

(51) Int. Cl.
*H01L 35/04* (2006.01)
(52) U.S. Cl. ........ 136/224; 136/205; 136/206; 136/220; 136/230; 62/3.2; 62/3.3
(58) Field of Classification Search .................. 136/205, 136/206, 224, 230, 220; 62/3.2, 3.3
See application file for complete search history.

(56) References Cited

U.S. PATENT DOCUMENTS

| | | | | |
|---|---|---|---|---|
| 3,870,568 A | * | 3/1975 | Oesterhelt et al. | 136/205 |
| 4,947,648 A | * | 8/1990 | Harwell et al. | 62/3.2 |
| 5,841,064 A | * | 11/1998 | Maekawa et al. | 136/224 |
| 6,855,880 B2 | | 2/2005 | Feher | |
| 2006/0243317 A1 | * | 11/2006 | Venkatasubramanian | 136/206 |
| 2007/0089773 A1 | * | 4/2007 | Koester et al. | 136/230 |
| 2007/0095381 A1 | | 5/2007 | Lee | |

FOREIGN PATENT DOCUMENTS

JP        2005-101544         4/2005

OTHER PUBLICATIONS

"First Office Action of China Counterpart Application", issued on Mar. 8, 2011, p. 1-p. 4.

* cited by examiner

*Primary Examiner* — Basia Ridley
*Assistant Examiner* — Andrew Golden
(74) *Attorney, Agent, or Firm* — Jianq Chyun IP Office

(57) ABSTRACT

A thermoelectric conversion device includes a hot terminal substrate, a cold terminal substrate and a stacked structure. The stacked structure is disposed between the hot terminal substrate and the cold terminal substrate. The stacked structure includes thermoelectric conversion layers each including a thermoelectric couple layer, a first conductive layer and a second conductive layer, a first heat-conductive and electrically insulating structure and a second heat-conductive and electrically insulating structure. Each of the thermoelectric conversion layers is arranged in the stacked structure. The first conductive layer includes first conductive materials and is arranged on tops of P/N type thermoelectric conversion elements. The second conductive layer includes second conductive materials and is arranged on bottoms of the P/N type thermoelectric conversion elements. The first heat-conductive and electrically insulating structure is connected between two adjacent first conductive layers. The second heat-conductive and electrically insulating structure is connected between two adjacent second conductive layers.

10 Claims, 5 Drawing Sheets

THERMOELECTRIC CONVERSION DEVICE

CROSS-REFERENCE TO RELATED APPLICATION

This application claims the priority benefit of Taiwan application serial no. 98107137, filed on Mar. 5, 2009. The entirety of the above-mentioned patent application is hereby incorporated by reference herein and made a part of specification.

BACKGROUND OF THE INVENTION

1. Field of the Invention

The present invention relates to a thermoelectric conversion device, and particularly to a thermoelectric conversion device having a stacked structure.

2. Description of Related Art

Development of technology of renewable energy has become an important issue due to problems of energy shortages. Taking automobiles as an example, waste heat of the engine accounts for one-third of power of the automobile; if the waste heat of gas emission is provided for electricity generation from thermoelectric conversion, consumption of fuel is reduced. In addition, factories and households emit large amounts of waste heat, and how to recycle and reuse the waste heat is an important issue. However, currently most waste heat does not have adequate recycling technology, so that waste of energy is caused.

Thermoelectric conversion technology has been one of key technologies of industrial research and development. A working principle of the thermoelectric conversion technology is linking an N type semiconductor material and a P type semiconductor material into a thermoelectric couple; by utilizing two ends of the N type and P type semiconductor material contacting different temperatures, energy transfer is generated and electric currents are generated in the thermoelectric couple. The above is called the Seebeck effect. Electricity generation by the thermoelectric conversion mainly uses temperature differences between the two ends of the N type and P type semiconductor materials to make the thermoelectric couple generate the electric currents, so that the electricity generation by the thermoelectric conversion does not cause pollution to the environment, and reaction speeds of the electricity generation by the thermoelectric conversion are fast. The electricity generation by the thermoelectric conversion may be further combined with technology of recycling the waste heat, thereby using the waste heat as a heat source for the electricity generation by the thermoelectric conversion and reducing waste of energy. In addition, a plurality of thermoelectric couples may be electrically and serially connected and stacked to form a thermoelectric conversion device, so as to comply with different requirements of electricity generation capacity. From another point of view, the thermoelectric conversion device directly converts heat into electricity and not through moving parts such as engine pistons, so that reliability of a structure of the thermoelectric conversion device is enhanced. Production of the thermoelectric conversion device may be combined with micro electromechanical and semiconductor processes, thereby largely reducing a volume of the thermoelectric conversion device.

However, the largest problem in application of the electricity generation by the thermoelectric conversion is the poor efficiency of the thermoelectric conversion. In order to enhance the efficiency of thermoelectric conversion of the thermoelectric device, thermoelectric material having superb thermoelectric characteristics may be developed through research and development of material technologies. In addition, since currently an assembly density of the thermoelectric conversion device is limited, electricity generation capacity by the thermoelectric conversion device is limited. Hence, another important technological direction of enhancing the efficiency of the thermoelectric conversion is improving a design of the structure of the thermoelectric conversion device and enhancing the assembly density of the thermoelectric conversion device, so as to improve the efficacy of the electricity generation by the thermoelectric conversion device.

SUMMARY OF THE INVENTION

The present invention provides a thermoelectric conversion device having a stacked structure, wherein the structure is used to enhance efficacy of electricity generation by the thermoelectric conversion device.

The present invention provides a thermoelectric conversion device, which includes a cold terminal substrate, a hot terminal substrate and a stacked structure. The stacked structure is disposed between the cold terminal substrate and the hot terminal substrate, and the stacked structure includes a plurality of thermoelectric conversion layers. Each of the thermoelectric conversion layers is arranged in the stacked structure. Each of the thermoelectric conversion layers includes a thermoelectric couple layer, a first conductive material layer and a second conductive material layer, a first heat-conductive and electrically insulating structure and a second heat-conductive and electrically insulating structure. The first conductive material layer includes a plurality of first conductive materials, and the second conductive material layer includes a plurality of second conductive materials. The thermoelectric couple layer includes a plurality of thermoelectric couples and each of the thermoelectric couples includes a P type thermoelectric conversion element and an N type thermoelectric conversion element, so that the first conductive material is electrically connected to a top of the P type thermoelectric conversion element and a top of the N type thermoelectric conversion element. The second conductive material is electrically connected to a bottom of the N type thermoelectric conversion element and a bottom of the P type thermoelectric conversion element adjacent thereto, and every two of the thermoelectric couples are connected in a serial manner. The first heat-conductive and electrically insulating structure is connected between two adjacent first conductive material layers and to the hot terminal substrate and conducts heat to the first conductive material layer, so that the first conductive material layer of each layers is maintained at a first operating temperature. The first operating temperature is a hot terminal operating temperature. The second heat-conductive and electrically insulating structure is connected between two adjacent second conductive material layers and to the cold terminal substrate and conducts heat to the second conductive material layer, so that the second conductive material layer of each of the layers is maintained at a second operating temperature, and the first operating temperature is not equal to the second operating temperature. The second operating temperature is a cold terminal operating temperature.

In light of the above, the thermoelectric conversion device of the present invention conducts heat through the first heat-conductive and electrically insulating structure and the second heat-conductive and electrically insulating structure, so that temperature differences between high temperature terminals and low temperature terminals of each of the thermoelectric conversion layers are maintained as a same temperature difference to make the temperature differences of the thermoelectric couple layers of each of the layers are almost the same, so as to enhance electricity generation capacity of each of the thermoelectric conversion layers, thereby enhancing efficacy of electricity generation by the thermoelectric conversion device.

In order to make the aforementioned and other features and advantages of the present invention more comprehensible, several embodiments accompanied with figures are described in detail at.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
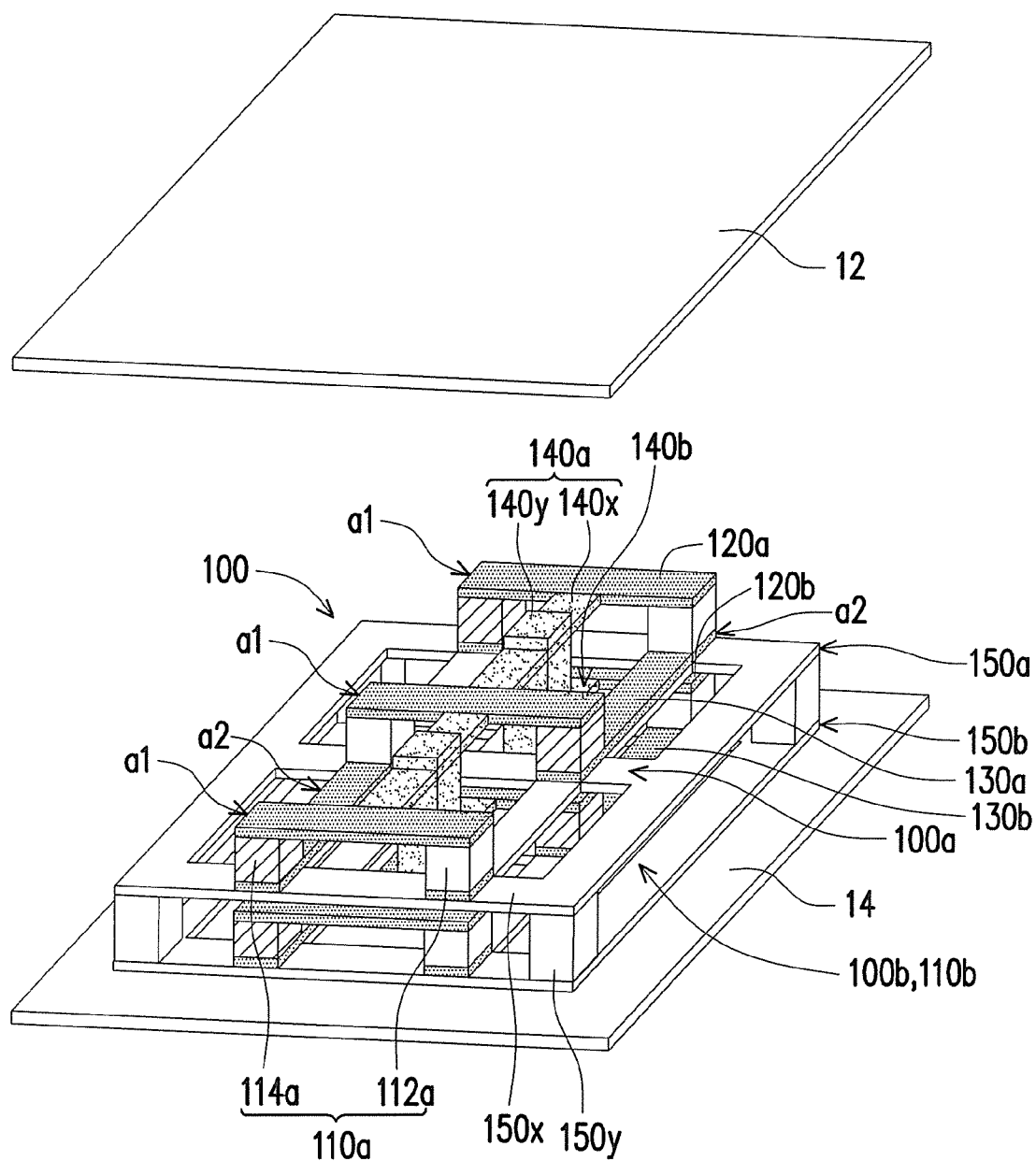
FIG. 1 is a structural view showing a thermoelectric conversion device according to an embodiment of the present invention.
Figure 2:
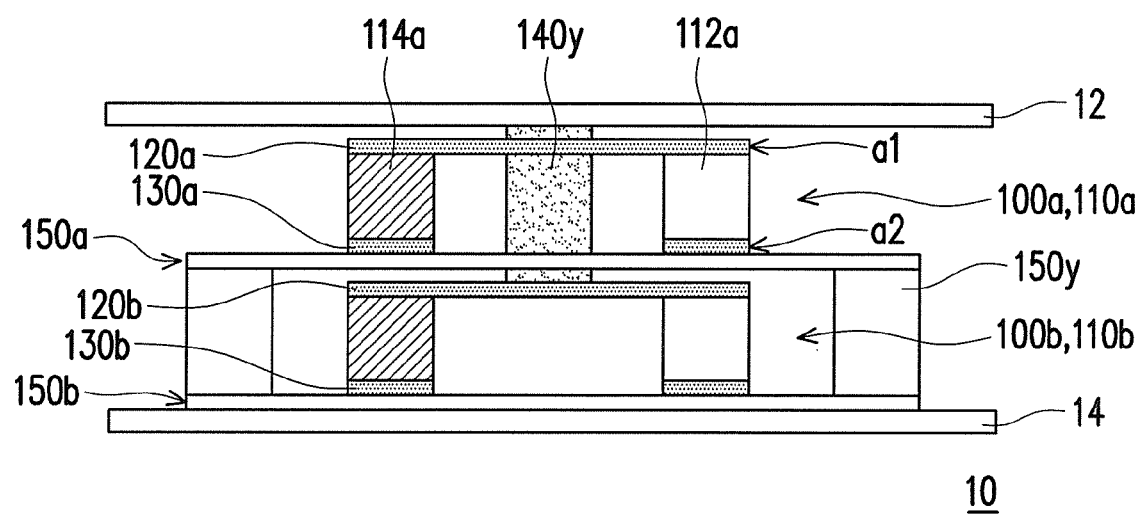
FIG. 2 is a side view showing the thermoelectric conversion device of FIG. 1.

FIG. 1 is a structural view showing a thermoelectric conversion device according to an embodiment of the present invention, and FIG. 2 is a side view showing the thermoelectric conversion device of FIG. 1. Referring to both FIGS. 1 and 2, a thermoelectric conversion device 10 according to the present embodiment includes a hot terminal substrate 12, a cold terminal substrate 14 and a stacked structure 100. The stacked structure 100 is disposed between the hot terminal substrate 12 and the cold terminal substrate 14, and the stacked structure 100 includes a plurality of thermoelectric conversion layers 100a and 100b. The thermoelectric conversion layer 100a includes a thermoelectric couple layer 110a, a first conductive material layer 120a and a second conductive material layer 130a, a first heat-conductive and electrically insulating structure 140a and a second heat-conductive and electrically insulating structure 150a. The thermoelectric conversion layer 100b includes a thermoelectric couple layer 110b, a first conductive material layer 120b and a second conductive material layer 130b, a first heat-conductive and electrically insulating structure 140b and a second heat-conductive and electrically insulating structure 150b. Each of the thermoelectric conversion layers 100a and 100b is arranged in the stacked structure 100. The present embodiment is only illustrated as follows using the thermoelectric conversion layer 100a of the uppermost layer. Illustration of the thermoelectric conversion layer 100b is similar to that of the thermoelectric layer 100a, so that it is omitted and not repeated illustrated.

Referring to both FIGS. 1 and 2, the thermoelectric couple layer 110a is arranged in the thermoelectric conversion layer 100a. The thermoelectric couple layer 110a includes a plurality of thermoelectric couples and each of the thermoelectric couples includes an N type thermoelectric conversion element 112a and a P type thermoelectric conversion element 114a. A material of the thermoelectric couple layer 110a includes, for example, semiconductor material such as $Bi_2Te_3$, $PbTe$, $Sb_2Te_3$ or SiGe or thermoelectric material having nanometer structures. The first conductive material layer 120a includes a plurality of first conductive materials a1. The first conductive materials a1 are respectively and electrically connected to a top of the N type thermoelectric conversion elements 112a and a top of the P type thermoelectric conversion elements 114a of the thermoelectric couple layer 110a of the thermoelectric conversion layer 100a. The second conductive material layer 130a includes a plurality of second conductive materials a2. The second conductive materials a2 are respectively electrically connected to a bottom of the N type thermoelectric conversion element 112a and a bottom the P type thermoelectric conversion element 114a adjacent thereto of the thermoelectric couple layer 110a of the thermoelectric conversion layer 100a. Every two of the thermoelectric couples are connected in a serial manner. In an above serially connected structure, when each of the thermoelectric couples are in a state of temperature difference, electric holes having positive charges in the P type thermoelectric conversion element 114a moves downward through the second conductive material layer 130a towards the N type thermoelectric conversion element 112a, and then moves upward through the N type thermoelectric conversion element 112a toward the first conductive material layer 120a to reach another P type thermoelectric conversion element 114a. The rest may be deduced by analogy, so as to generate a current.

Moreover, the first heat-conductive and electrically insulating structure 140a may be connected to the first conductive material layer 120a of the thermoelectric conversion layer 100a; a main function is to conduct heat to the first conductive material layer 120a of the thermoelectric conversion layer 100a, so that the first conductive material layer 120a is almost maintained at the a first operating temperature (for example a hot terminal operating temperature), so as to minimize a temperature difference between the first conductive material layer 120a in the thermoelectric conversion layer 100a and the first conductive material layer 120b in the thermoelectric conversion layer 100b adjacent thereto. The second heat-conductive and electrically insulating structure 150a is used to connect the second conductive material layer 130a of the thermoelectric conversion layer 100a and conduct heat to the second conductive material layer 130a of the thermoelectric conversion layer 100a, so that the second conductive material layer 130a is maintained at a second operating temperature (for example a cold terminal operating temperature), so as to minimize a temperature difference between the second conductive material layer 130a in the thermoelectric conversion layer 100a and the second conductive material layer 130b in the thermoelectric conversion layer 100b. The first operating temperature is not equal to the second operating temperature, so as to maintain a temperature difference between the hot terminal and the cold terminal. Materials of the first heat-conductive and electrically insulating structure 140a and the second heat-conductive and electrically insulating structure 150a may be materials having good heat conductivity and electrically insulating, so as to effectively conduct heat to the first conductive material layer 120a and the second conductive material layer 130a respectively and not to influence effects of generating electricity by each of the thermoelectric couples.

Still referring to FIG. 1, the second heat-conductive and electrically insulating structure 150a according to the present embodiment includes a horizontal connecting structure 150x. The horizontal connecting structure 150x includes a plurality of horizontal rods which are connected to each other. In addition, there is also a vertical connecting structure 150y between the adjacent horizontal connecting structures 150x. The vertical connecting structure 150y includes a plurality of props. The props are vertically connected between the horizontal rods, so as to be maintained within a predetermined height. It should be noted that all the horizontal connecting structures 150x do not contact the first conductive material layers 120a and 120b, but contact the second conductive material layer 130a. Hence, the temperature of the horizontal connecting structure 150x does not influence temperatures of the first conductive material layers 120a and 120b, so that the temperature difference between the first conductive material layer 120a and the second conductive material layer 130a of the thermoelectric conversion layer 100a and the temperature difference between the first conductive material layer 120b and the second conductive material layer 130b of the thermoelectric conversion layer 100b are maintained at a same temperature difference.

In addition, according to the present embodiment, the first heat-conductive and electrically insulating material 140a includes a horizontal connecting structures 140x and a plurality of vertical connecting structures 140y connected between the horizontal connecting structures 140x. The horizontal connecting structure 140x is used to horizontally connected to the first conductive material layer 120a, and the vertical connecting structures 140y are vertically and respectively arranged in a tetragonal reticular structure. The horizontal connecting structure 140x includes a plurality of horizontal rods, and the vertical connecting structures 140y include a plurality of props. The props are vertically connected between the horizontal rods, so as to be maintained within a predetermined height.

Referring to FIG. 1, the thermoelectric conversion device 10 has the hot terminal substrate 12 and the cold terminal substrate 14. The hot terminal substrate 12 is connected to the stereoscopic first heat-conductive and electrically insulating structures 140a and 140b. The cold terminal substrate 14 is connected to the stereoscopic second heat-conductive and electrically insulating structures 150a and 150b. The heat of the hot terminal substrate 12 is respectively conducted to the first conductive material layers 120a and 120b through the first heat-conductive and electrically insulating structures 140a and 140b, so that the first conductive material layers 120a and 120b are maintained at the first operating temperature (for example the hot terminal operating temperature). The heat of the cold terminal substrate 14 is respectively conducted to the second conductive material layers 130a and 130b through the second heat-conductive and electrically insulating structures 150a and 150b, so that the second conductive material layers 130a and 130b are maintained at the second operating temperature (for example the cold terminal operating temperature). Materials of the hot terminal substrate 12 and the cold terminal substrate 14 are, for example, highly heat-conductive materials such as silicon substrates or ceramic substrates.

Figure 3:
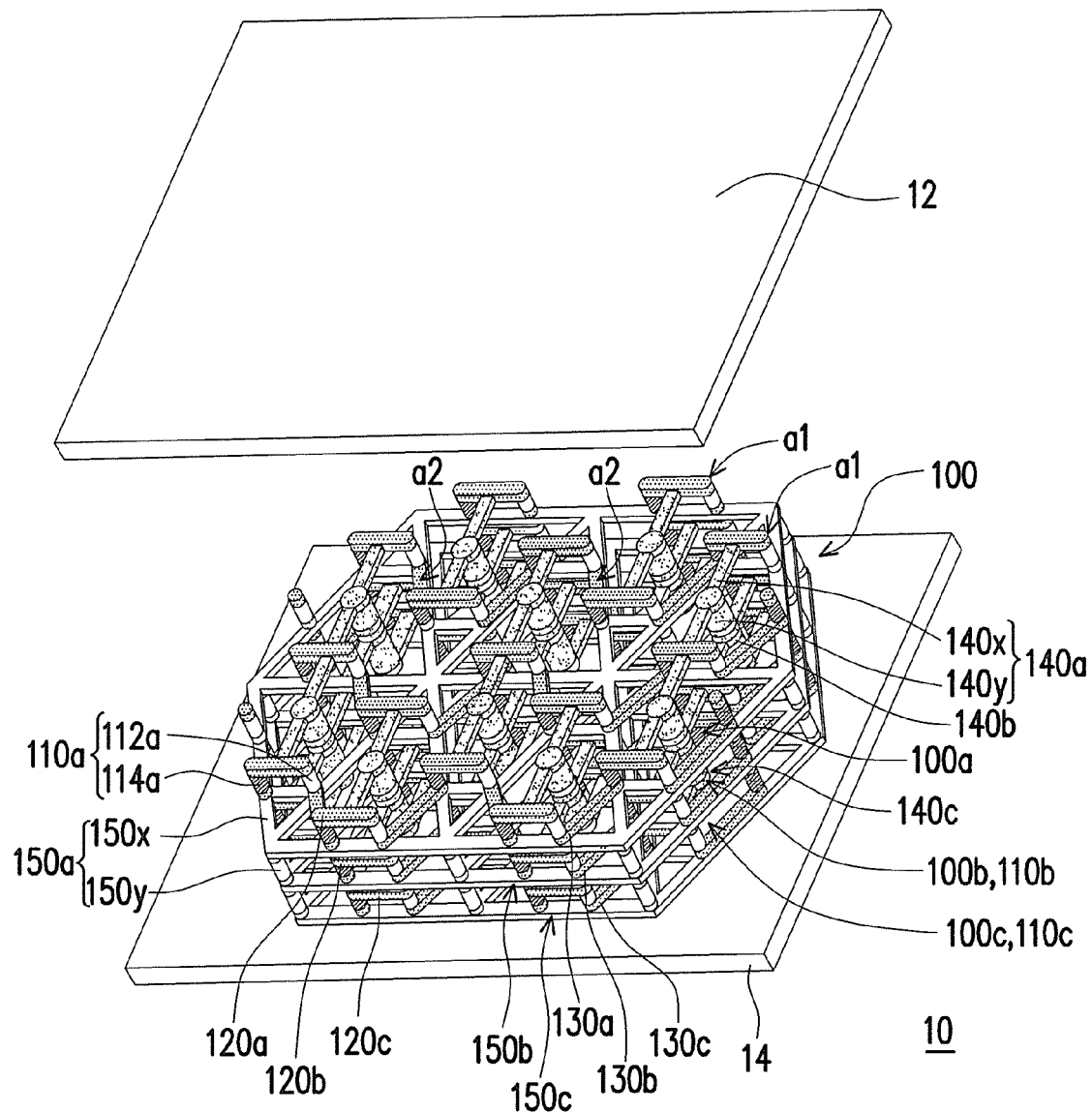
FIG. 3 is a structural view showing a thermoelectric conversion device according to another embodiment of the present invention.
Figure 4:
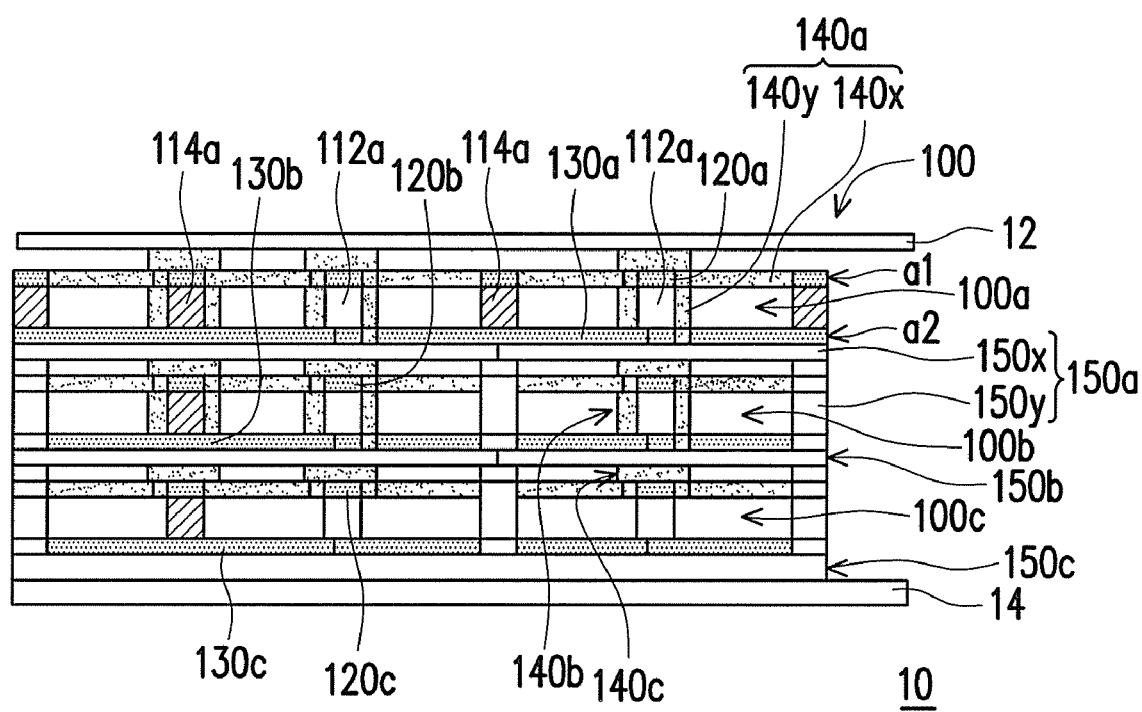
FIG. 4 is a side view showing the thermoelectric conversion device of FIG. 3.
Figure 5:
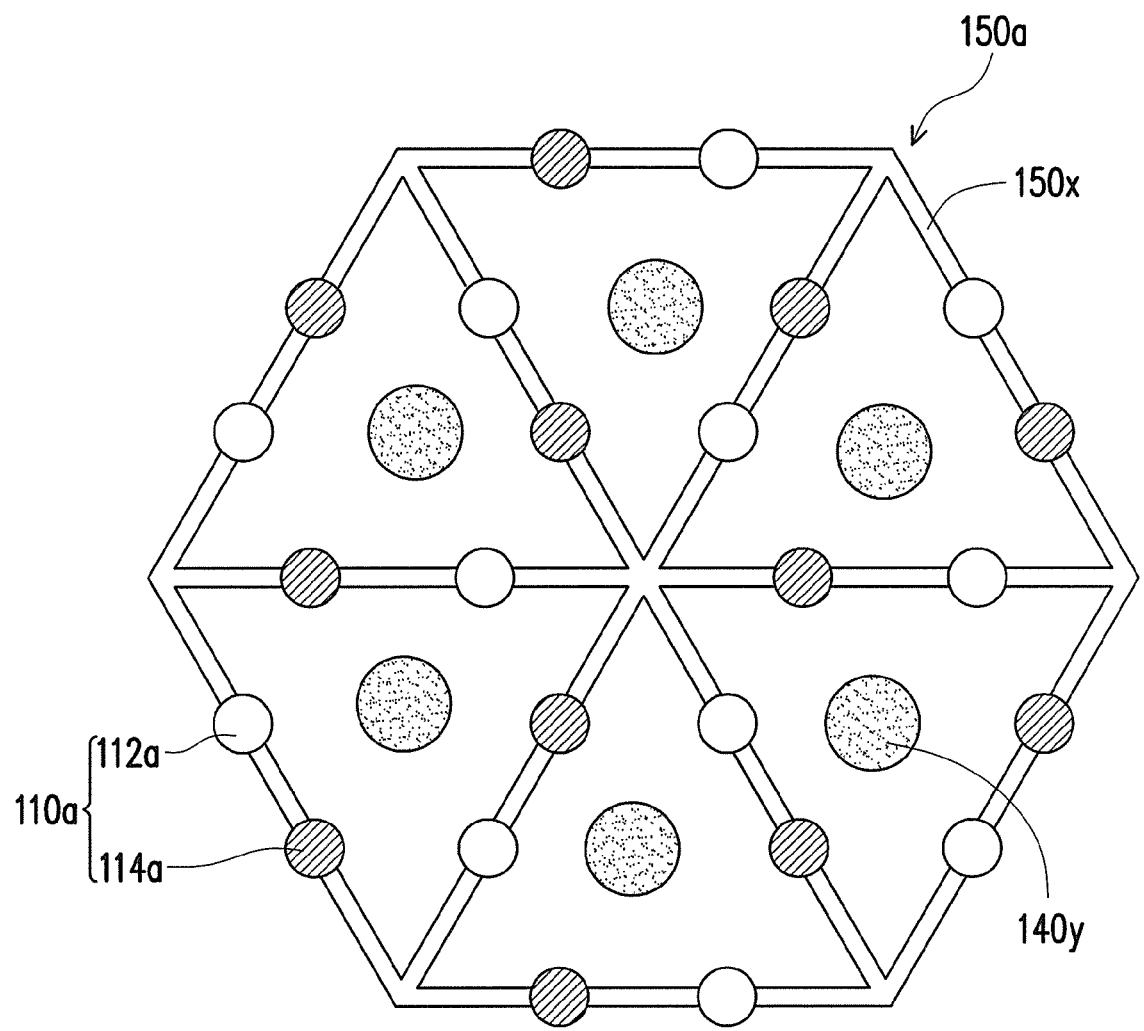
FIG. 5 is a simplified top view of the thermoelectric conversion device of FIG. 3.

FIG. 3 is a structural view showing a thermoelectric conversion device according to another embodiment of the present invention, FIG. 4 is a side view showing the thermoelectric conversion device of FIG. 3, and FIG. 5 is a simplified top view of the thermoelectric conversion device of FIG. 3. The thermoelectric conversion device 10 according to the present embodiment includes a hot terminal substrate 12, a cold terminal substrate 14 and a stacked structure 100. The stacked structure 100 is disposed between the hot terminal substrate 12 and the cold terminal substrate 14, and the stacked structure 100 includes a plurality of thermoelectric conversion layers 100a, 100b and 100c. The thermoelectric conversion layer 100a includes a thermoelectric couple layer 110a, a first conductive material layer 120a and a second conductive material layer 130a, a first heat-conductive and electrically insulating structure 140a and a second heat-conductive and electrically insulating structure 150a. The thermoelectric conversion layer 100b includes a thermoelectric couple layer 110b, a first conductive material layer 120b and a second conductive material layer 130b, a first heat-conductive and electrically insulating structure 140b and a second heat-conductive and electrically insulating structure 150b. The thermoelectric conversion layer 100c includes a thermoelectric couple layer 110c, a first conductive material layer 120c and a second conductive material layer 130c, a first heat-conductive and electrically insulating structure 140c and a second heat-conductive and electrically insulating structure 150c. The present embodiment is illustrated using the three thermoelectric conversion layers 100a, 100b and 100c, the three thermoelectric couple layers 110a, 110b and 110c, the three first conductive material layers 120a, 120b and 120c, the three second conductive material layers 130a, 130b and 130c, the three first heat-conductive and electrically insulating structures 140a, 140b and 140c and the three second heat-conductive and electrically insulating structures 150a, 150b and 150c. Each of the thermoelectric conversion layers 100a, 100b and 100c is arranged in the stacked structure 100. The present embodiment is only illustrated as follows using the thermoelectric conversion layer 100a of the uppermost layer. Illustrations of the thermoelectric conversion layers 100b and 100c are similar to that of the thermoelectric layer 100a, so that they are omitted and not repeated illustrated.

The thermoelectric couple layer 110a is arranged in the thermoelectric conversion layer 100a. The thermoelectric couple layer 110a includes a plurality of thermoelectric couples, and each of the thermoelectric couples includes the P type thermoelectric conversion elements 114a and the N type thermoelectric conversion element 112a. A material of the thermoelectric couple layer 110a includes, for example, semiconductor material such as $Bi_2Te_3$, $PbTe$, $Sb_2Te_3$ or $SiGe$ or thermoelectric material having nanometer structures. The first conductive material layer 120a includes a plurality of first conductive materials a1. The first conductive materials a1 are respectively and electrically connected to the top of the P type thermoelectric conversion elements 114a and the top of the N type thermoelectric conversion elements 112a of the thermoelectric couples. The second conductive material layer 130a includes the plurality of second conductive materials a2. The second conductive materials a2 are respectively and electrically connected to the bottom of the P type thermoelectric conversion elements 114a and the bottom of the N type thermoelectric conversion elements 112a of the thermoelectric couples. The P type thermoelectric conversion element is connected to another N type thermoelectric conversion element, and every two of the thermoelectric couples are connected in a serial manner. In the above structure, when each of the thermoelectric couples are in the state of temperature difference, electric holes having positive charges in the P type thermoelectric conversion element 114a moves downward through the second conductive material layer 130a towards the N type thermoelectric conversion element 112a, and moves upward through the N type thermoelectric conversion element 112a towards the first conductive material layer 120a to reach another P type thermoelectric conversion element 114a. The rest may be deduced by analogy, so as to generate a current.

Moreover, the first heat-conductive and electrically insulating structure 140a may be connected to the first conductive material layer 120a of the thermoelectric conversion layer 100a; a main function is to conduct heat to the first conductive material layer 120a of the thermoelectric conversion layer 100a, so that the first conductive material layer 120a is almost maintained at the first operating temperature (for example the hot terminal operating temperature), so as to minimize the temperature difference between the first conductive material layer 120a in the thermoelectric conversion layer 100a and the first conductive material layer 120b and 120c in the thermoelectric conversion layer 100b and 100c respectively. The second heat-conductive and electrically insulating structure 150a is used to connect to the second conductive material layer 130a of the thermoelectric conversion layer 100a and conduct heat to the second conductive material layer 130a of the thermoelectric conversion layer 100a, so that the second conductive material layer 130a is maintained at the second operating temperature (for example the cold terminal operating temperature), so as to minimize a temperature difference between the second conductive material layer 130a in the thermoelectric conversion layer 100a and the second conductive material layer 130b and 130c in the thermoelectric conversion layer 100b and 100c respectively. The first operating temperature is not equal to the second operating temperature, so as to maintain the temperature difference between the hot terminal and the cold terminal. The materials of the first heat-conductive and electrically insulating structure 140a and the second heat-conductive and electrically insulating structure 150a may be materials having good heat conductivity and electrically insulating, so as to effectively conduct heat to the first conductive material layer 120a and the second conductive material layer 130a respectively and not to influence effects of generating electricity by each of the thermoelectric couples.

Still referring to FIG. 3, the second heat-conductive and electrically insulating structure 150a according to the present embodiment includes a horizontal connecting structure 150x. The horizontal connecting structure 150x includes a plurality of horizontal rods which are connected to each other. In addition, there is also a vertical connecting structure 150y between the adjacent horizontal connecting structures 150x. The vertical connecting structure 150y includes a plurality of props. The props are vertically connected between the horizontal rods, so as to be maintain within a predetermined height. It should be noted that all the horizontal connecting structures 150x do not contact the first conductive material layers 120a, 120b and 120c, but contact the second conductive material layer 130a. Hence, the temperature of the horizontal connecting structure 150x does not influence temperatures of the first conductive material layers 120a, 120b and 120c, so that the temperature difference between the first conductive material layer 120a and the second conductive material layer 130a of the thermoelectric conversion layer 100a, the temperature difference between the first conductive material layer 120b and the second conductive material layer 130b of the thermoelectric conversion layer 100b and the temperature difference between the first conductive material layer 120c and the second conductive material layer 130c of the thermoelectric conversion layer 100c are maintained at a same temperature difference.

In addition to the rectangular structure and the hexagonal structure, other geometrical shapes are all included in the scope of the spirit of the present invention.

Referring to FIG. 3, the first heat-conductive and electrically insulating material 140a includes a horizontal connecting structure 140x and a plurality of vertical connecting structures 140y connected between the horizontal connecting structure 140x. The horizontal connecting structure 140x includes a plurality of rods, and the vertical connecting structures 140y include a plurality of props. The props are vertically connected between the horizontal rods, so as to be maintained at a predetermined height. The horizontal connecting structures 140x horizontally connect to the first conductive material layers 120a adjacent thereto, and the vertical connecting structures 140y are respectively and vertically disposed in a triangular or near-triangular structure and connects to the horizontal connecting structure 140x adjacent thereto. Through the stereoscopic first heat-conductive and electrically insulating structure 140a, the temperature of the first conductive material layer 120a is almost maintained at the first operating temperature, which is the hot terminal operating temperature.

As shown in FIG. 5, the horizontal connecting structure 150x of the second heat-conductive and electrically insulating structure 150a may be arranged into a hexagonal reticular structure (formed by connecting six triangular or near-triangular structures), and the P type thermoelectric conversion elements 114a and the N type thermoelectric conversion elements 112a of the thermoelectric couple layer 110a are arranged in a form of a hexagonal structure on the horizontal connecting structure 150x. In addition to the rectangular structure and the hexagonal structure, other geometrical shapes are all included in the scope of the spirit of the present invention.

Referring to FIG. 3, the thermoelectric conversion device 10 has the hot terminal substrate 12 and the cold terminal substrate 14. The hot terminal substrate 12 is connected to the stereoscopic first heat-conductive and electrically insulating structures 140a, 140b and 140c. The cold terminal substrate 14 is connected to the stereoscopic second heat-conductive and electrically insulating structures 150a, 150b and 150c. The heat of the hot terminal substrate 12 is respectively conducted to the first conductive material layers 120a, 120b and 120c through the first heat-conductive and electrically insulating structures 140a, 140b and 140c, so that the first conductive material layers 120a, 120b and 120c are maintained at the first operating temperature (for example the hot terminal operating temperature). The heat of the cold terminal substrate 14 is respectively conducted from the second conductive material layers 130a, 130b and 130c through the second heat-conductive and electrically insulating structures 150a, 150b and 150c, so that the second conductive material layers 130a, 130b and 130c are maintained at the second operating temperature (for example the cold terminal operating temperature). The materials of the hot terminal substrate 12 and the cold terminal substrate 14 are, for example, highly heat-conductive materials such as silicon substrates or ceramic substrates. For example, the temperature of the cold terminal substrate 14 is 45° C. When the temperatures of the horizontal connecting structures 150a, 150b and 150c of each of the layers are between 45° C. to 48° C., the temperatures of the second conductive material layer 130a, 130b and 130c of each of the layers are maintained between 45° C. to 48° C. However, the temperature of the hot terminal substrate 12 is 80° C. The temperatures of the first conductive material layers 120a, 120b and 120c of each of the layers are maintained at 70° C. to 80° C., because of the temperature difference between the first conductive material layer 120a and the second conductive material layer 130a, meaning that the temperature difference between the top and the bottom of any of the P type and N type thermoelectric conversion elements is maintained at about 30° C., and that the temperature differences of each of the layers are maintained at about the same. On the contrary, in a conventional stacked structure, obvious gradient differences appear due to contact between a top layer and a bottom layer of a heat conducting structure, for example 80° C., 65° C., 55° C. and 45° C. Hence, a first conductive material layer and a second conductive material layer of each conventional layers cannot be maintained at a same temperature difference, and if temperature differences of each of the layers are maintained between 10° C. and 15° C., efficacy is more inferior.

In summary, the thermoelectric conversion device of the present invention uses the first heat-conductive and electrically insulating structure to make heat of the first conductive material layers of each of the layers be conducted between each other to lower the temperature gradient, and uses the second heat-conductive and electrically insulating structure to make heat of the second conductive material layers of each of the layers be conducted between each other to lower the temperature gradient. Hence, the first conductive material layer and the second conductive material layer above and below the thermoelectric conversion layer are maintained at almost the same temperature difference, thereby enhancing the efficacy of electricity generation by the thermoelectric conversion device.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A thermoelectric conversion device, comprising:
a cold terminal substrate;
a hot terminal substrate; and
a stacked structure disposed between the cold terminal substrate and the hot terminal substrate, the stacked structure comprising a plurality of thermoelectric conversion layers, each of the thermoelectric conversion layers comprising:
  a thermoelectric couple layer disposed in the thermoelectric conversion layer, the thermoelectric couple layer comprising a plurality of thermoelectric couples, each of the thermoelectric couples comprising a P type thermoelectric conversion element and an N type thermoelectric conversion element;
  a first conductive material layer comprising a plurality of first conductive materials, each of the first conductive materials being electrically connected to a top of the P type thermoelectric conversion element and a top of the N type thermoelectric conversion element of the thermoelectric couple;
  a second conductive material layer comprising a plurality of second conductive materials, each of the second conductive materials being electrically connected to a bottom of the P type thermoelectric conversion element and a bottom of the N type thermoelectric conversion element of the thermoelectric couple, and every two of the thermoelectric couples are connected in a serial manner;
  a first heat-conductive and electrically insulating structure connected between adjacent said first conductive material layers and directly connected to the hot terminal substrate, the first heat-conductive and electrically insulating structure comprising:
    a plurality of first horizontal structures, comprising a plurality of first horizontal rods connected to each other, wherein the first horizontal connecting structures do not contact the second conductive material layer but horizontally contact the first conductive material layer; and
    a plurality of first vertical connecting structures, comprising a plurality of first props connected vertically between the first horizontal, rods wherein the first vertical connecting structures are vertically and respectively arranged in a geometrical shapes structure; and
  a second heat-conductive and electrically insulating structure connected between adjacent said second conductive material layers and directly connected to the cold terminal substrate, the second heat-conductive and electrically insulating structure comprising:
    a plurality of second horizontal connecting structures, comprising a plurality of second horizontal rods connected to each other, wherein the second horizontal connecting structures do not contact the first conductive material layer but horizontally contact the second conductive material layer; and
    a plurality of second vertical connecting structures, comprising a plurality of second props, and the second props vertically connected between the second horizontal rods.

2. The thermoelectric conversion device of claim 1, wherein the first heat-conductive and electrically insulating structure conducts heat to the first conductive material layer, so that the first conductive material layer of each of the thermoelectric conversion layers is maintained at a first operating temperature, and the second heat-conductive and electrically insulating structure conducts heat to the second conductive material layer, so that the second conductive material layer of each of the thermoelectric conversion layers is maintained at a second operating temperature, the first operating temperature being not equal to the second operating temperature.

3. The thermoelectric conversion device of claim 2, wherein the first operating temperature is a hot terminal operating temperature and the second operating temperature is a cold terminal operating temperature.

4. The thermoelectric conversion device of claim 1, wherein the second horizontal rods are arranged into a reticular structure, and the second conductive material layer is disposed on the reticular structure.

5. The thermoelectric conversion device of claim 4, wherein the reticular structure has a geometrical shape.

6. The thermoelectric conversion device of claim 1, wherein the P type thermoelectric conversion elements and the N type thermoelectric conversion elements of each of the thermoelectric conversion layers are arranged as a hexagonal structure.

7. The thermoelectric conversion device of claim 1, wherein the P type thermoelectric conversion elements and the N type thermoelectric conversion elements of each of the thermoelectric conversion layers are arranged as a tetragonal structure.

8. The thermoelectric conversion device of claim 1, wherein a material of the cold terminal substrate comprises a silicon substrate or a ceramic substrate.

9. The thermoelectric conversion device of claim 1, wherein a material of the hot terminal substrate comprises a silicon substrate or a ceramic substrate.

10. The thermoelectric conversion device of claim 1, wherein a material of the thermoelectric couples comprises $Bi_2Te_3$, $PbTe$, $Sb_2Te_3$ or $SiGe$.

* * * * *